United States Patent
Lee et al.

(10) Patent No.: US 9,301,417 B2
(45) Date of Patent: Mar. 29, 2016

(54) SEALING MATERIAL, DISPLAY DEVICE, AND METHOD OF MANUFACTURING THE DISPLAY DEVICE

(71) Applicant: SAMSUNG ELECTRONICS CO., LTD., Suwon-si, Gyeonggi-do (KR)

(72) Inventors: Eun Sung Lee, Hwaseong-si (KR); Se Yun Kim, Seoul (KR); Jin Man Park, Seoul (KR); Young Hwan Kim, Seongnam-si (KR); Suk Jun Kim, Suwon-si (KR); Sang Soo Jee, Hwaseong-si (KR); Sang Mock Lee, Yongin-si (KR); In Taek Han, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 255 days.

(21) Appl. No.: 13/941,789

(22) Filed: Jul. 15, 2013

(65) Prior Publication Data

US 2014/0016253 A1    Jan. 16, 2014

(30) Foreign Application Priority Data

Jul. 13, 2012 (KR) .................. 10-2012-0076830
Jul. 12, 2013 (KR) .................. 10-2013-0082382

(51) Int. Cl.
*H05K 7/14*     (2006.01)
*H05K 13/04*    (2006.01)
*B23K 35/24*    (2006.01)
*G02F 1/1339*   (2006.01)

(52) U.S. Cl.
CPC ........ *H05K 7/14* (2013.01); *B23K 35/24* (2013.01); *G02F 1/1339* (2013.01); *H05K 13/04* (2013.01); *G02F 2202/08* (2013.01)

(58) Field of Classification Search
CPC ........... H05K 7/14; H05K 13/04; B23K 35/24
See application file for complete search history.

(56) References Cited

U.S. PATENT DOCUMENTS

| | | | |
|---|---|---|---|
| 7,719,191 B2 * | 5/2010 | Nishimura et al. | 313/582 |
| 7,863,207 B2 * | 1/2011 | Son et al. | 501/24 |
| 7,923,393 B2 * | 4/2011 | Son et al. | 501/24 |
| 8,067,883 B2 | 11/2011 | Wang | |
| 8,147,976 B2 * | 4/2012 | Boek et al. | 428/432 |
| 8,350,302 B2 | 1/2013 | Lee et al. | |
| 8,436,275 B2 | 5/2013 | Kim | |
| 2007/0170855 A1 * | 7/2007 | Choi et al. | 313/512 |
| 2009/0218932 A1 | 9/2009 | Wang | |
| 2011/0114954 A1 | 5/2011 | Lee et al. | |
| 2012/0064793 A1 | 3/2012 | Kim | |

FOREIGN PATENT DOCUMENTS

| KR | 1020100127247 A | 12/2010 |
|---|---|---|
| KR | 1020110055251 A | 5/2011 |
| KR | 1020110072131 A | 6/2011 |
| KR | 1020110075466 A | 7/2011 |
| KR | 1020110137217 A | 12/2011 |
| KR | 10-1106173 B1 | 1/2012 |
| KR | 10-1108157 B1 | 1/2012 |
| KR | 1020120010068 A | 2/2012 |
| KR | 1020120028636 A | 3/2012 |

* cited by examiner

*Primary Examiner* — Elmito Breval
(74) *Attorney, Agent, or Firm* — Cantor Colburn LLP

(57) ABSTRACT

A sealing material includes a metallic glass.

20 Claims, 2 Drawing Sheets

US 9,301,417 B2

SEALING MATERIAL, DISPLAY DEVICE, AND METHOD OF MANUFACTURING THE DISPLAY DEVICE

CROSS-REFERENCE TO RELATED APPLICATIONS

This application claims priority to Korean Patent Applications No. 10-2012-0076830 and No. 10-2013-0082382 filed on Jul. 13, 2012 and Jul. 12, 2013, respectively, and all the benefits accruing therefrom under 35 U.S.C. §119, the entire contents of which are incorporated herein by reference.

BACKGROUND

1. Field

Provided is a sealing material, a display device and a method of manufacturing the same.

2. Description of the Related Art

In a display device, a sealant is used to adhere and fix two facing substrates in a flat panel display such as a liquid crystal display ("LCD"), an organic light emitting diode ("OLED") display, a plasma display panel ("PDP)", a field emission display, and the like.

For example, an OLED display, one of flat panel displays, includes a base substrate on which an organic light emitting diode is disposed, and a cover substrate covering the organic light emitting diode and reducing or effectively preventing degradation of the organic light emitting diode. The sealant adheres and fixes the base substrate and the cover substrate to each other in the OLED, and reduces or effectively prevents oxygen and moisture from flowing into an area between the base substrate and the cover substrate.

SUMMARY

An embodiment provides a sealing material which is capable of being formed into a sealant at a relatively low temperature and which prevents degradation of a display device employing the sealant.

An embodiment also provides the display device to which the sealant is applied and which includes the sealant.

An embodiment also provides a method of manufacturing the display device.

According to an embodiment, a sealing material includes a metallic glass.

The metallic glass may have a glass transition temperature of less than or equal to about 300° C.

The metallic glass may have a glass transition temperature of about 10° C. to about 200° C.

The metallic glass may include a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof.

The cerium (Ce) metallic glass, strontium (Sr) metallic glass, gold (Au) metallic glass, calcium (Ca) metallic glass, yttrium (Y) metallic glass, zinc (Zn) metallic glass, and magnesium (Mg) metallic glass may be alloys including cerium (Ce), strontium (Sr), gold (Au), calcium (Ca), yttrium (Y), zinc (Zn), and magnesium (Mg) as a first component, respectively, and each independently may further include nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), mercury (Hg), or a combination thereof.

The sealing material may be in a form of a ribbon or a paste.

When the sealing material may be in a form of the paste, the paste may further include an organic vehicle.

The metallic glass may be included in an amount of about 10 wt % to about 90 wt %, based on the total weight of the sealing material.

According to another embodiment, provided is a display device which includes a first substrate and a second substrate facing each other, an active layer interposed between the first and second substrates, and a sealant between the first substrate and the second substrate, which adheres and fixes the first substrate and second substrate to each other, and including a heat-treated sealing material, wherein the sealing material comprises includes a metallic glass.

The metallic glass may have a glass transition temperature of less than or equal to about 300° C.

The metallic glass may have a glass transition temperature of about 10° C. to about 200° C.

The metallic glass may include a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof.

The cerium (Ce) metallic glass, strontium (Sr) metallic glass, gold (Au) metallic glass, calcium (Ca) metallic glass, yttrium (Y) metallic glass, zinc (Zn) metallic glass, and magnesium (Mg) metallic glass may be alloys including cerium (Ce), strontium (Sr), gold (Au), calcium (Ca), yttrium (Y), zinc (Zn), and magnesium (Mg) as a first component, respectively, and each independently may further include nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), mercury (Hg), or a combination thereof.

The display device may include a liquid crystal display ("LCD"), an organic light emitting diode ("OLED") display, a plasma display panel ("PDP"), or a field emission display.

According to yet another embodiment, provided is a method of manufacturing the display device, including providing a first substrate and a second substrate, respectively, applying a sealing material including a metallic glass to the first substrate, the second substrate, or a combination thereof, positioning the first and second substrates to face each other with the sealing material disposed therebetween, and heat-treating the sealing material to form a sealant which adheres and fixes the first substrate and the second substrate to each other.

The sealing material including the metallic glass may be in the form of a ribbon or a paste.

The heat-treating the sealing material may be performed at a temperature of less than or equal to about 300° C.

The heat-treating the sealing material may be performed at a temperature higher than a glass transition temperature of the metallic glass.

The heat-treating the sealing material may be performed at a temperature between the glass transition temperature of the metallic glass and a crystallization temperature of the metallic glass.

The heat-treating the sealing material may include applying a pressure to the facing first and second substrates having the sealing material therebetween.

BRIEF DESCRIPTION OF THE DRAWINGS

The above and other features of this disclosure will become more apparent be describing in further detail embodiments thereof with reference to the accompanying drawings, in which.

DETAILED DESCRIPTION

Figure 1:
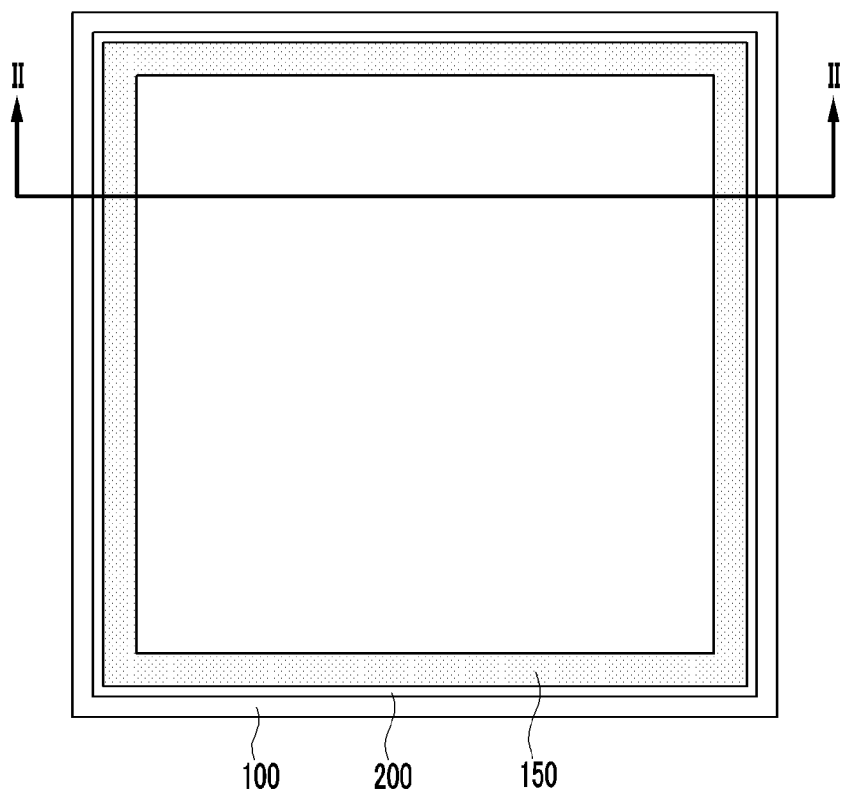
FIG. 1 is a top plan view showing an organic light emitting diode ("OLED") display according to one embodiment.

Embodiments of the present invention will hereinafter be described in detail and may be easily performed by those who have common knowledge in the related art. This disclosure may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "under," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

In a display device, a flat panel display includes two substrates which face and are coupled to each other. For example, the flat panel display may include a base substrate on which a light-emitting element is disposed, and a cover substrate covering the light-emitting element and reducing or effectively preventing degradation of the light-emitting element. The sealant adheres and fixes the base substrate and the cover substrate to each other in the flat panel display, and reduces or effectively prevents oxygen and moisture from flowing into an area between the base substrate and the cover substrate.

The sealant may generally include a material including an oxide glass. However, the oxide glass has a relatively high softening point greater than or equal to about 350 degrees Celsius (° C.) and therefore the material needs to be processed at a relatively high temperature equal to or greater than the softening point. Where a flat panel display includes the sealant including material with the oxide glass, the high temperature process for the oxide glass may deteriorate the flat panel display. Therefore there remains a need for an improved sealant and/or sealant material, such as for use in a flat panel display, which reduces or effectively prevents deterioration of the flat panel display due to processing of the sealant material.

Hereinafter, a sealant according to an embodiment is described.

The sealing material according to an embodiment includes a metallic glass.

The metallic glass is an amorphous alloy having a random atomic structure and including a plurality of metals, and which may also be described as an amorphous metal. The metallic glass includes an amorphous part formed by rapidly solidifying a plurality of elements. Herein, the amorphous part may be about 50 volume % to about 100 volume % of the metallic glass, particularly, about 70 volume % to about 100 volume %, and more particularly, about 90 volume % to about 100 volume %, based on the total volume of the metallic glass.

The metallic glass may maintain its amorphous character, which may be formed when being a liquid at a high temperature, even at room temperature. Accordingly, when the metallic glass is solidified into a solid phase, the structure of the metallic glass differs from a general metal alloy with a crystalline structure in that atoms are regularly arranged and also differs from a liquid metal maintaining a liquid phase at room temperature due to melting point of lower than or equal to room temperature.

The metallic glass may be plastically deformed at a glass transition temperature (Tg) and show a liquid-like behavior. The liquid-like behavior may be maintained in a supercooled liquid region, which is a temperature region between a glass transition temperature (Tg) and a crystallization temperature ($T_x$).

The metallic glass may show the liquid-like behavior in a supercooled liquid region and have wettability with respect to adjacent layers. When a sealing material including the metallic glass is applied between two facing substrates, the metallic glass is plastically deformed in the supercooled liquid region and may have wettability with respect to the substrates. Accordingly, the sealing material may have a larger contact area with the substrates and increases a close contacting property with the substrates, and thus may reduce or effectively prevent the flow of oxygen and moisture to an area between the substrates.

In addition, the metallic glass is plastically deformed in the supercooled liquid region and includes a closely packed material structure and thus may form a dense structure. Accordingly, the sealant formed by the sealing material including the metallic glass may have a dense structure without pores and thus reduces or effectively prevents the flow of oxygen and moisture to between the two substrates.

In addition, the metallic glass is an alloy including a plurality of metals and/or semi-metals, as aforementioned, which may react with oxygen and form a metal oxide. Accordingly, the sealant formed by the sealing material including a metallic glass reacts with oxygen remaining in a display device to decrease the oxygen concentration in the display device.

The metallic glass may have a glass transition temperature of less than or equal to about 300° C. The metallic glass may have a glass transition temperature of about 10° C. to about 200° C. When the metallic glass has a glass transition temperature within the above-described range, the metallic glass may be plastically deformed by a heat treatment at a relatively low temperature for forming a sealant without using a high temperature process. Accordingly, the sealant using the sealing material is formed by processing at the relatively low temperature, compared with a conventional sealant formed by processing a material including an oxide glass having a relatively high softening point of greater than or equal to about 350° C., deterioration due to heat, of a display device to which the sealant is applied, may be reduced or effectively prevented.

The metallic glass having a glass transition temperature within the above-described range may include, for example, a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof, but is not limited thereto.

The cerium (Ce) metallic glass, strontium (Sr) metallic glass, gold (Au) metallic glass, calcium (Ca) metallic glass, yttrium (Y) metallic glass, zinc (Zn) metallic glass, and magnesium (Mg) metallic glass may be alloys including cerium (Ce), strontium (Sr), gold (Au), calcium (Ca), yttrium (Y), zinc (Zn), and magnesium (Mg) as a first component, respectively, and each independently may further include, for example, nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), mercury (Hg), or a combination thereof. Herein, the first component is included in the greatest ratio among the components of the metallic glass, for example, in a ratio of greater than or equal to about 40 mol %, based on 100 mol % of the metallic glass.

Table 1 shows glass transition temperatures (Tg) and crystallization temperatures (Tx) of embodiments of a metallic glass.

TABLE 1

|  | Tg (° C.) | Tx (° C.) |  | Tg (° C.) | Tx (° C.) |
| --- | --- | --- | --- | --- | --- |
| $Ce_{70}Al_{10}Cu_{20}$ | 68 | 128 | $Yb_{64}Zn_{20}Mg_{15}Cu_1$ | 84 | 129 |
| $Ce_{68}Al_{10}Cu_{20}Nb_2$ | 68 | 149 | $Au_{49}Cu_{26.9}Ag_{5.5}Pd_{2.3}Si_{16.3}$ | 128 | 186 |
| $Sr_{60}Mg_{18}Zn_{22}$ | 58 | 101 | $Yb_{70}Zn_{20}Mg_{10}$ | 74 | 113 |
| $Sr_{60}Li_{11}Mg_9Zn_{20}$ | 26 | 50 | $Yb_{62.5}Zn_{20}Mg_{17.5}$ | 94 | 125 |
| $Sr_{60}Li_5Mg_{15}Zn_{20}$ | 42 | 63 | $Yb_{64}Zn_{20}Mg_{15}Cu_1$ | 84 | 129 |
| $Sr_{60}Mg_{20}Zn_{15}Cu_5$ | 62 | 101 | $Yb_{65}Zn_{20}Mg_{10}Cu_5$ | 111 | 146 |
| $Sr_{40}Yb_{20}Mg_{20}Zn_{15}Cu_5$ | 63 | 105 | $Yb_{62.5}Zn_{15}Mg_{17.5}Cu_5$ | 108 | 128 |

TABLE 1-continued

| | Tg (° C.) | Tx (° C.) | | Tg (° C.) | Tx (° C.) |
|---|---|---|---|---|---|
| $Au_{50}Cu_{33}Si_{17}$ | 110 | 132 | $Zn_{40}Mg_{11}Ca_{31}Yb_{18}$ | 123 | 148 |
| $Au_{50}Cu_{25.5}Ag_{7.5}Si_{17}$ | 104 | 146 | $Zn_{40}Mg_{11}Ca_{35}Yb_{14}$ | 120 | 147 |
| $Au_{60}Cu_{15.5}Ag_{7.5}Si_{17}$ | 86 | 130 | $Ca_{65}Mg_{15}Zn_{20}$ | 102 | 137 |
| $Au_{65}Cu_{10.5}Ag_{7.5}Si_{17}$ | 69 | 119 | $Ca_{65}Li_{9.96}Mg_{8.54}Zn_{16.5}$ | 44 | 66 |
| $Au_{70}Cu_{5.5}Ag_{7.5}Si_{17}$ | 66 | 102 | $Mg_{65}Cu_{25}Y_{10}$ | 155 | 219 |
| $Ce_{70}Cu_{20}Al_{10}$ | 68 | 135 | $Mg_{65}Cu_{20}Gd_{10}Ag_5$ | 154 | 192 |
| $Ca_{65}Li_{9.96}Mg_{8.54}Zn_{16.5}$ | 44 | 66 | | | |

The sealing material including the metallic glass may be in the form of a ribbon or a paste, such as is used in an embodiment where the sealing material is applied in the manufacturing of a display device. The ribbon may have a substantially plate shape which is elongated in an extension direction.

When the sealing material including the metallic glass is applied as a ribbon, the ribbon may be positioned where a sealant is to be disposed and heat-treated to form the sealant. When the sealing material including the metallic glass is applied as a paste, the paste may be coated where a sealant is to be disposed and heat-treated to form the sealant.

When the sealing material including the metallic glass is applied as a paste, the paste may further include an organic vehicle. The metallic glass may be included in an amount of about 10 wt % to about 90 wt %, based on the total weight of the sealing material. When the metallic glass is included within the above-described range, the metallic glass may have sufficient wettability and a dense structure.

The organic vehicle may include an organic compound mixed with the metallic glass to provide a selected viscosity, and/or a solvent that may dissolve or disperse the metallic glass and/or the organic compound.

The organic compound may include, for example, a (meth)acrylate-based resin, a cellulose resin such as ethyl cellulose, a phenolic resin, an alcohol resin, tetrafluoroethylene (e.g., TEFLON®), or a combination thereof, and may further include an additive such as a surfactant, a thickener, or a stabilizer.

The solvent may be any solvent being capable of dissolving or dispersing the metallic glass and/or the above organic compounds, and may include, for example, terpineol, butylcarbitol, butylcarbitol acetate, pentanediol, dipentyne, limonene, ethylene glycol alkylether, diethylene glycol alkylether, ethylene glycol alkylether acetate diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, methyl alcohol, ethyl alcohol, isopropyl alcohol, acetone, deionized water, or a combination thereof.

The sealing material may further include a filler.

Hereinafter, an embodiment of a display device including a sealant including the heat-treated sealing material is further described.

The display device may be any display device to which the sealant is applied, and may include, for example, a liquid crystal display ("LCD"), an organic light emitting diode ("OLED") display, a plasma display panel ("PDP"), a field emission display ("FED"), and the like, without limitation.

The display device includes two substrates facing each other, an active layer interposed between the two substrates, and a sealant adhering and fixing the two substrates to each other. The sealant may include a heat-treated sealing material and the sealing material may be any one of the above-described embodiments of the sealing material. The active layer may include, for example, a light emitting diode, a liquid crystal layer, a field emissive layer, and the like.

An OLED display as an example is described referring to the drawings.

Hereinafter, referring to FIGS. 1 and 2, an OLED display according to one embodiment is described.

Figure 2:
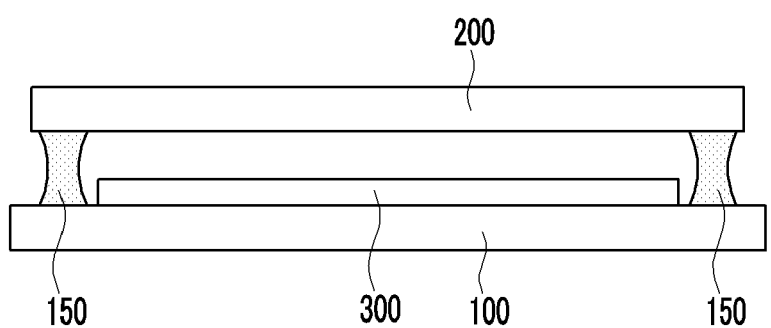
FIG. 2 is a cross-sectional view taken along line II-II of the OLED display depicted in FIG. 1.

FIG. 1 is a top plan view of an OLED display according to one embodiment, and FIG. 2 is a cross-sectional view taken along line II-II of the OLED display depicted in FIG. 1.

An OLED display according to one embodiment includes a base substrate 100 and a cover substrate 200 facing each other, a light emitting diode 300 interposed between the base substrate 100 and cover substrate 200, and a sealant 150 adhering and fixing the base substrate 100 and cover substrate 200 to each other.

The base substrate 100 is positioned under the light emitting diode 300 and supports the light emitting diode 300. The base substrate 100 may include, for example, glass, a silicon wafer, a polymer, and the like.

The cover substrate 200 seals the light emitting diode 300 in a space defined by the base substrate 100, the cover substrate 200 and the sealant 150. The cover substrate 200 may block moisture and oxygen from flowing into the space, and to the light emitting diode 300, from an outside of the OLED. The cover substrate 200 may include glass, a polymer thin film, or a metal, but not being limited thereto.

The light emitting diode 300 may include an anode, a cathode, a light emitting layer, and optionally at least one auxiliary layer, but not being limited thereto. In one embodiment, the auxiliary layer may include a hole transferring layer, a hole injection layer, an electron transferring layer and/or an electron injection layer.

The sealant 150 may have an elongated and substantially uniform width band shape along the edge of the base substrate 100 and the cover substrate 200 in a plan view, but is not limited thereto. The sealant 150 adheres the base substrate 100 to the cover substrate 200 and fixes them together.

In an embodiment of manufacturing the display device and/or the OLED, the sealant 150 may be formed (e.g., provided) by applying and heat-treating an embodiment of the sealing material, where such sealing material includes the metallic glass. In an embodiment of manufacturing the sealant, the sealant may be formed (e.g., provided) by heat-treating the sealing material including the metallic glass at a process temperature which is greater than or equal to a glass transition temperature of the metallic glass, for example, a temperature between the glass transition temperature and the crystallization temperature of the metallic glass. Where the sealing material including the metallic glass is heat-treated at the temperature greater than or equal to a glass transition temperature, the metallic glass exists in a heat-treated form such as a sintered product.

The metallic glass may have a glass transition temperature of less than or equal to about 300° C., and specifically about 10° C. to about 200° C. The metallic glass having the above-described glass transition temperature may include a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof, but is not limited thereto.

The final form of the sealant 150 may have a relative high bonding affinity and high close contacting property with the base substrate 100 and the cover substrate 200 due to wettability of the metallic glass of the sealing material in a supercooled liquid region thereof. In addition, the final form of the sealant 150 may have a dense structure without pores due to a liquid-like behavior of the metallic glass in a supercooled liquid region.

Hereinafter, an embodiment of a method of manufacturing the OLED display is described referring to FIGS. 1 and 2.

A method of manufacturing according to one embodiment includes preparing a base substrate 100 on which a light emitting diode 300 is provided, preparing a cover substrate 200, applying a sealing material including a metallic glass to the base substrate 100, the cover substrate 200, or a combination thereof, positioning the base substrate 100 and the cover substrate 200 to be opposed each other, and heat-treating the sealing material.

The sealing material including the metallic glass may be applied as a ribbon or a paste.

The heat-treating the sealing material may be performed at a temperature of less than or equal to about 300° C.

The heat-treating the sealing material may be performed at a higher temperature than a glass transition temperature of the metallic glass. The metallic glass may have a glass transition temperature of less than or equal to about 300° C., and specifically about 10° C. to about 200° C. In one embodiment, for example, the heat treatment may be performed at a temperature between the glass transition temperature and the crystallization temperature of the metallic glass.

In the heat-treatment, the metallic glass is plastically deformed and shows a liquid-like behavior. Herein, the final form of the sealant 150 may be formed to have a rigid structure and a high close contact property with a substrate by applying a pressure to the base substrate 100 and/or cover substrate 200 with the sealing material therebetween, for example, under a vacuum atmosphere.

After the heat treatment, the sealing material is cooled to room temperature from the higher processing temperature.

In this way, the final form of the sealant 150 may be formed at a relatively low temperature of less than or equal to about 300° C. and may reduce or effectively prevent deterioration of an active layer such as a light emitting diode during manufacturing of the display device and/or flat panel display.

The following examples illustrate this disclosure in further detail. However, it is understood that this disclosure shall not be limited by these examples.

EXAMPLE 1

A metallic glass, $Ce_{68}Cu_{20}Al_{10}Nb_2$, is prepared to have a relatively long and uniform diameter rod-shape with a diameter of 3 millimeters (mm) and a length of 2 centimeters (cm), and is ground with a high energy ball mill to prepare $Ce_{68}Cu_{20}Al_{10}Nb_2$ powder having an average particle diameter of less than or equal to about 10 micrometers (μm). The $Ce_{68}Cu_{20}Al_{10}Nb_2$ powder is dispersed in ethanol to prepare a paste ($Ce_{68}Cu_{20}Al_{10}Nb_2$ powder 50 wt %), and the paste is dripped on a first glass plate. The glass plate is dried under an air atmosphere to remove the ethanol and leave the $Ce_{68}Cu_{20}Al_{10}Nb_2$ thereon. Next, a second glass plate is disposed to cover the first glass plate. The two glass plates are closely adhered using a pair of clamps. Then, the adhered glass plates are heat-treated by increasing a process temperature up to 200° C. for 10 seconds using rapid thermal process ("RTP") equipment, and then at 200° C. for 1 minute. The heat-treated glass plates are cooled down to room temperature, and the clamps are removed.

As a result, the two glass plates are adhered together after removing the clamps. Accordingly, the metallic glass $Ce_{68}Cu_{20}Al_{10}Nb_2$ forms a sealant at a relatively low temperature of about 200° C.

EXAMPLE 2

A metallic glass, $Mg_{65}Cu_{20}Gd_{10}Ag_5$, is prepared to have a rod-shape with a diameter of 3 mm and a length of 2 cm, and is ground with a high energy ball mill to prepare $Mg_{65}Cu_{20}Gd_{10}Ag_5$ powder having an average particle diameter of less than or equal to about 10 μm. The $Mg_{65}Cu_{20}Gd_{10}Ag_5$ powder is dispersed in ethanol to prepare a paste ($Mg_{65}Cu_{20}Gd_{10}Ag_5$ powder 50 wt %), and the paste is dripped on a pair of first glass plates. The first glass plates are dried under an air atmosphere to remove the ethanol and leave the $Mg_{65}Cu_{20}Gd_{10}Ag_5$ thereon.

Next, second glass plates are disposed to respectively cover the first glass plates. The pairs of two glass plates are closely adhered using a pair of clamps. Then, the pairs of adhered glass plates are heat-treated up to 200° C. for 10 seconds using RTP equipment, and then at 200° C. for 1 minute. The heat-treating for one pair of adhered glass plates is performed under $N_2$ atmosphere and the heat-treating for the other pair of adhered glass plates is performed under air atmosphere. The heat-treated pairs of glass plates are cooled down to room temperature, and the clamps are removed.

As a result, each of the pairs of two glass plates are adhered together after removing the clamps, even after the heat-treating under $N_2$ atmosphere and air atmosphere. A test using a double-side adhesive tape confirms that the each pair of two glass plates are adhered together even after the heat-treating under $N_2$ atmosphere and air atmosphere. Further, it is confirmed that the glass plates heat-treated under $N_2$ atmosphere have a slightly higher adhesion than the glass plates heat-treated under air atmosphere. Accordingly, the metallic glass $Mg_{65}Cu_{20}Gd_{10}Ag_5$ forms a sealant at a relatively low temperature of about 200° C.

EXAMPLE 3

A metallic glass, $Mg_{65}Cu_{20}Gd_{10}Ag_5$, is prepared as an initial ribbon-shape with a thickness of 100 μm, a width of 5 mm, and a length of 10 cm, and the initial ribbon is cut to have a 1 cm length to prepare $Mg_{65}Cu_{20}Gd_{10}Ag_5$ plate-shaped metallic glass. The $Mg_{65}Cu_{20}Gd_{10}Ag_5$ plate-shaped metallic glass is positioned on a first glass plate, and a second glass plate is disposed to cover the first glass plate. The two glass plates are closely adhered using a pair of clamps. Then, the adhered glass plates are heat-treated up to 200° C. for 10 seconds using RTP equipment, and then at 200° C. for 1 minute. The heat-treated glass plates are cooled down to room temperature, and the clamps are removed.

As a result, the two glass plates are adhered together after removing the clamps. Accordingly, the $Mg_{65}Cu_{20}Gd_{10}Ag_5$ plate-shaped metallic glass forms a sealant at a relatively low temperature of about 200° C.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A sealing material comprising a metallic glass, the metallic glass being an amorphous alloy having a random atomic structure and including a plurality of metals.

2. The sealing material of claim 1, wherein the metallic glass has a glass transition temperature of less than or equal to about 300° C.

3. The sealing material of claim 2, wherein the metallic glass has a glass transition temperature of about 10° C. to about 200° C.

4. The sealing material of claim 1, wherein the metallic glass comprises a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof.

5. The sealing material of claim 4, wherein the cerium (Ce) metallic glass, strontium (Sr) metallic glass, gold (Au) metallic glass, calcium (Ca) metallic glass, yttrium (Y) metallic glass, zinc (Zn) metallic glass, and magnesium (Mg) metallic glass are alloys comprising cerium (Ce), strontium (Sr), gold (Au), calcium (Ca), yttrium (Y), zinc (Zn), and magnesium (Mg) as a first component, respectively, and wherein each independently further comprises nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), mercury (Hg), or a combination thereof.

6. The sealing material of claim 1, wherein the sealing material is in a form of a ribbon or a paste.

7. The sealing material of claim 6, wherein
the sealing material is in the form of the paste, and
the paste further comprises an organic vehicle.

8. The sealing material of claim 7, wherein the metallic glass is in an amount of about 10 wt % to about 90 wt % based on the total weight of the paste.

9. A display device comprising:
a first substrate and a second substrate facing each other,
an active layer between the first substrate and the second substrate, and
a sealant between the first substrate and the second substrate, which adheres and fixes the first substrate and second substrate to each other, and including a heat-treated sealing material,
wherein the sealing material comprises a metallic glass, the metallic glass being an amorphous allow having a random atomic structure and including a plurality of metals.

10. The display device of claim 9, wherein the metallic glass has a glass transition temperature of less than or equal to about 300° C.

11. The display device of claim 10, wherein the metallic glass has a glass transition temperature of about 10° C. to about 200° C.

12. The display device of claim 9, wherein the metallic glass comprises a cerium (Ce) metallic glass, a strontium (Sr) metallic glass, a gold (Au) metallic glass, a calcium (Ca) metallic glass, a yttrium (Y) metallic glass, a zinc (Zn) metallic glass, a magnesium (Mg) metallic glass, or a combination thereof.

13. The display device of claim 12, wherein the cerium (Ce) metallic glass, strontium (Sr) metallic glass, gold (Au) metallic glass, calcium (Ca) metallic glass, yttrium (Y) metallic glass, zinc (Zn) metallic glass, and the magnesium (Mg) metallic glass are alloys comprising cerium (Ce), strontium (Sr), gold (Au), calcium (Ca), yttrium (Y), zinc (Zn), and magnesium (Mg) as a first component, respectively, and wherein each independently further comprises nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), mercury (Hg), or a combination thereof.

14. The display device of claim 9, wherein the display device comprises a liquid crystal display, an organic light emitting diode display, a plasma display panel or a field emission display.

15. A method of manufacturing a display device, comprising:
providing a first substrate and a second substrate, respectively;
applying a sealing material comprising a metallic glass to the first substrate, the second substrate, or a combination thereof;
positioning the first substrate and the second substrate to face each other with the sealing material disposed therebetween, the metallic glass being an amorphous allow having a random atomic structure and including a plurality of metals; and
heat-treating the sealing material to form a sealant which adheres and fixes the first substrate and the second substrate to each other.

16. The method of claim 15, wherein the sealing material is in the form of a ribbon or a paste.

17. The method of claim 15, wherein the heat-treating the sealing material is performed at a temperature of less than or equal to about 300° C.

18. The method of claim 15, wherein the heat-treating the sealing material is performed at a temperature higher than a glass transition temperature of the metallic glass.

19. The method of claim 18, wherein the heat-treating the sealing material is performed at a temperature between the glass transition temperature of the metallic glass and a crystallization temperature of the metallic glass.

20. The method of claim 15, wherein the heat-treating the sealing material comprises applying a pressure to the facing first and second substrates having the sealing material therebetween.

* * * * *